(12) United States Patent
Vrtis et al.

(10) Patent No.: US 8,043,976 B2
(45) Date of Patent: Oct. 25, 2011

(54) ADHESION TO COPPER AND COPPER ELECTROMIGRATION RESISTANCE

(75) Inventors: Raymond Nicholas Vrtis, Orefield, PA (US); Laura M. Matz, Allentown, PA (US); Mark Leonard O'Neill, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 190 days.

(21) Appl. No.: 12/406,467

(22) Filed: Mar. 18, 2009

(65) Prior Publication Data

US 2009/0236745 A1 Sep. 24, 2009

Related U.S. Application Data

(60) Provisional application No. 61/038,874, filed on Mar. 24, 2008, provisional application No. 61/074,843, filed on Jun. 23, 2008.

(51) Int. Cl.
*H01L 23/52* (2006.01)
(52) U.S. Cl. ............ 438/761; 438/778; 257/E21.214
(58) Field of Classification Search ............ 257/761, 257/E21.214; 438/624, 761, 776; 428/34.1
See application file for complete search history.

(56) References Cited

U.S. PATENT DOCUMENTS

| | | | |
|---|---|---|---|
| 5,494,742 A | 2/1996 | Seki et al. |
| 6,147,000 A | 11/2000 | You et al. |
| 6,342,733 B1 | 1/2002 | Hu et al. |
| 6,444,264 B2 | 9/2002 | Hintermaier et al. |
| 6,479,389 B1 | 11/2002 | Tsai et al. |
| 6,846,515 B2 | 1/2005 | Vrtis et al. |
| 6,979,625 B1 | 12/2005 | Woo et al. |
| 7,013,916 B1 | 3/2006 | Pearlstein et al. |
| 7,087,524 B2 | 8/2006 | Park |
| 7,153,774 B2 | 12/2006 | Hau-Riege et al. |
| 7,193,325 B2 | 3/2007 | Wu et al. |
| 7,229,911 B2 | 6/2007 | Rajagopalan et al. |
| 7,247,946 B2 | 7/2007 | Bruley et al. |
| 7,332,445 B2 | 2/2008 | Lukas et al. |

(Continued)

FOREIGN PATENT DOCUMENTS

CN 1946875 A 4/2007
(Continued)

OTHER PUBLICATIONS

Munehiro Tada, et al, Improving Reliability of Copper Dual-Damascene Interconnects by Impurity Doping and Interface Strengthening, IEEE Transactions on Electron Devices, Aug. 2007, 1867-1877, 54.

S. Chhun, et al, Cu surface treatment influence on Si adsorption properties of CuSiN self-aligned barriers for sub-65 nm technology node, Microelectronic Engineering, 2006, 2094-2100, 83.

H. Kim, et al, Process design of Cu(Sn) alloy deposition for highly reliable ultra large-scale integration interconnects, Thin Solid Films, 2005, 221-227, 491.

(Continued)

*Primary Examiner* — Roy Potter
(74) *Attorney, Agent, or Firm* — Lina Yang

(57) ABSTRACT

The present invention relates to the improved adhesion between a patterned conductive metal layer, usually a copper layer, and a patterned barrier dielectric layer. The structure with the improved adhesion comprises an adhesion layer between a patterned barrier dielectric layer and a patterned conductive metal layer. The adhesion layer improves adhesion between the metal layer and the barrier layer without increasing the copper bulk electrical resistance. The method of making the structure with the improved adhesion comprises steps of thermal expositing the patterned conductive metal layer to an organometallic precursor to deposit an adhesion layer at least on the top of the patterned conductive metal layer.

36 Claims, 6 Drawing Sheets

U.S. PATENT DOCUMENTS

| | | | |
|---|---|---|---|
| 7,351,449 | B2 | 4/2008 | Hunt et al. |
| 7,374,701 | B2 | 5/2008 | Hwang et al. |
| 2002/0098681 | A1 | 7/2002 | Hu et al. |
| 2003/0207564 | A1* | 11/2003 | Ahn et al. .................... 438/638 |
| 2005/0266673 | A1 | 12/2005 | Hu et al. |
| 2007/0125884 | A1 | 6/2007 | Bloc et al. |
| 2007/0299239 | A1 | 12/2007 | Weigel et al. |

FOREIGN PATENT DOCUMENTS

| | | |
|---|---|---|
| JP | 2006-063386 A | 9/2006 |
| KR | 100443796 | 11/2004 |
| KR | 10-0907387 B1 | 7/2009 |
| KR | 10-0974778 B1 | 8/2010 |
| WO | 0108213 A1 | 2/2001 |

OTHER PUBLICATIONS

James R. Lloyd, et al, Electromigration and Adhesion, IEEE Transactions on Device and Materials Reliability, Mar. 2005, 113-118, 5.

Peter Singer, The Advantages of Capping Copper With Cobalt, Semiconductor International, Oct. 2005, 44-48.

E. Todd Ryan, et al, Line Resistance and Electromigration Variations Induced by Hydrogen-Based Plasma Modifications to the Silicon Carbonitride/Copper Interface, Journal of the Electrochemical Society, 2007, H604-H610, 154.

M.Y. Yan, et al, Effect of Cu3Sn coatings on electromigration lifetime improvement of Cu dual-damascene interfonnects, Applied Physics Letters, 2005, 211103-1-3, 87.

* cited by examiner

ADHESION TO COPPER AND COPPER ELECTROMIGRATION RESISTANCE

CROSS-REFERENCE TO RELATED APPLICATIONS

This Application claims the benefit of Provisional Application No. 61/038,874, filed Mar. 24, 2008, and No. 61/074,843 filed on Jun. 23, 2008.

BACKGROUND OF THE INVENTION

In the fabrication of semiconductor devices, increased density and speed has caused a shift in the metallization system from Al to Cu to reduce the resistance of the conductor. To reduce the capacitive coupling between adjacent metal lines, materials having low k dielectric constant are used to form dielectric layers between adjacent metal lines. Furthermore, to prevent diffusion of copper containing materials into the surrounding low k dielectric layers, barrier layers are forms between metal layers and dielectric layers.

However, it has been observed that between the copper planarization and the subsequent dielectric layer deposition, the copper material may be subjected to an oxidation reaction through exposure between processing chambers or processing tools. The exposure to an oxidizing environment results in the formation of surface oxides on the copper material. The oxides inhibit the adhesion of subsequent layers, for example, the dielectric layer, that are deposited thereover. Copper adhesion and electromigration resistance are extremely important properties affecting device yield and device lifetimes. Patents and patent applications in this technological field include U.S. Pat. Nos. 7,229,911 B2, 7,193,325 B2, 7,153,774 B2 and WO 01/08213 A1.

Accordingly, there is a need for an improved process for making a semiconductor device that includes copper interconnects. There is a need for such a process that reduces electromigration without significantly raising conductor resistance. The method of the present invention provides such a process.

BRIEF SUMMARY OF THE INVENTION

The present invention relates to the improved adhesion between a patterned conductive metal layer, and the patterned barrier dielectric layer deposited on top of it.

One embodiment discloses a structure comprises:
(a) at least one patterned dielectric layer and at least one patterned conductive metal layer;
(b) an adhesion layer selectively deposited at least on the at least one patterned conductive metal layer, said adhesion layer is selected from the group consisting of tin and zinc; and
(c) a dielectric barrier layer covering the at least one patterned dielectric layer and the at least one patterned conductive metal layer having the adhesion layer.

Another embodiment discloses a method comprises the steps of:
(a) providing a substrate in a processing chamber; wherein the substrate comprises at least one patterned dielectric layer and at least one patterned conductive metal layer; and
(b) introducing an organometallic precursor to the processing chamber to selectively deposit an adhesion layer at least on the at least one patterned conductive metal layer; wherein the organometallic precursor is selected from the group consisting of organozinc, organosilver, organochromium, organotin, organomanganese, organonickel, organocobalt, organoaluminum, and mixtures thereof.

Yet, another embodiment discloses a method comprises the steps of:
(a) providing a substrate in a processing chamber; wherein the substrate comprises at least one patterned dielectric layer and at least one patterned conductive metal layer;
(b) exposing the substrate to a pre-treatment;
(c) introducing an organotin precursor to the processing chamber to selectively deposit an adhesion layer at least on the at least one patterned conductive metal layer after the pre-treatment in (b);
(d) exposing the substrate having the adhesion layer to a post-treatment; and
(e) depositing a dielectric barrier layer on the substrate having the adhesion layer after the post-treatment in (d).

Yet, another embodiment discloses an article of manufacture comprising
organotin;
a solvent selected from the group consisting of a hydrocarbon with formula $C_nH_{(2n+2-x)}$; where n is 3-10 and x is equal to the number of cyclic structures or the degrees of unsaturation; an oxygen containing solvents; and combinations thereof; and
a container comprising an interior volume bounded by interior wall, an inlet, and an outlet;
wherein the organotin is solubilized in the solvent, mixture of the organotin and the solvent is contained and delivered in the container.

The at least one patterned dielectric layer comprises a material selected from the group consisting of silicon dioxide, fluorosilicate glass (FSG), organosilicate glass (OSG, aka carbon doped glass (CDO)), a porous organosilicate glass having a dielectric constant of less than 3.0, and mixtures thereof.

The at least one patterned conductive metal layer can be a copper, copper alloy layer, or mixtures thereof.

The organometallic precursor is selected from the group consisting of Tetramethyltin ($Me_4Sn$), dibutyldimethyltin, tributyltin hydride, Tetraalkyltin, trialkyltin hydride, dialkyltin dihydride, Alkylalkoxytin, Tetraalkoxytin, tetrakis(dialkylamino)tin, tin hydride ($SnH_4$), tin deuteride ($SnD_4$), cyclopentadienyl cobalt dicarbonyl ($CpCo(CO)_2$), nitrosyl cobalt pentacarbonyl, cyclopentadienyl manganese tricarbonyl ($CpMn(CO)_3$), bis(ethylcyclopentadienyl)nickel (($EtCp)_2Ni$), Diethylzinc ($Et_2Zn$), Diethylzinc-Trimethylamine adduct, Dimethylzinc, Dialkylzinc, amine adducts of Dialkylzinc, Nickel hexacarbonyl ($Ni(CO)_6$), Tungsten hexafluoride ($WF_6$), Chromium hexacarbonyl ($Cr(CO)_6$), trimethylaluminum, dimethylethylamine alane (DMEAA), and Tungsten hexacarbonyl ($W(CO)_6$).

The organotin precursor is selected from the group consisting of tetramethyltin ($Me_4Sn$), dibutyldimethyltin, tributyltin hydride, tetraalkyltin, trialkyltin hydride, dialkyltin dihydride, Ilkylalkoxytin, tetraalkoxytin, tetrakis(dialkylamino) tin, tin hydride ($SnH_4$), tin deuteride ($SnD_4$), and mixtures thereof.

The dielectric barrier layer is selected from the group consisting of: silicon nitride, silicon oxide, silicon carbide, silicon oxycarbide, silicon oxynitride, silicon carbonitride, silicon oxycarbonitride and mixtures thereof. The barrier layer has a dielectric constant of less than 7.

The pre-treatment and the post-treatment are selected from the group consisting of $H_2$ plasma, $NH_3$ plasma, $H_2$/He plasma, and $H_2/N_2$ plasma.

DETAILED DESCRIPTION OF THE INVENTION

Figure 1:
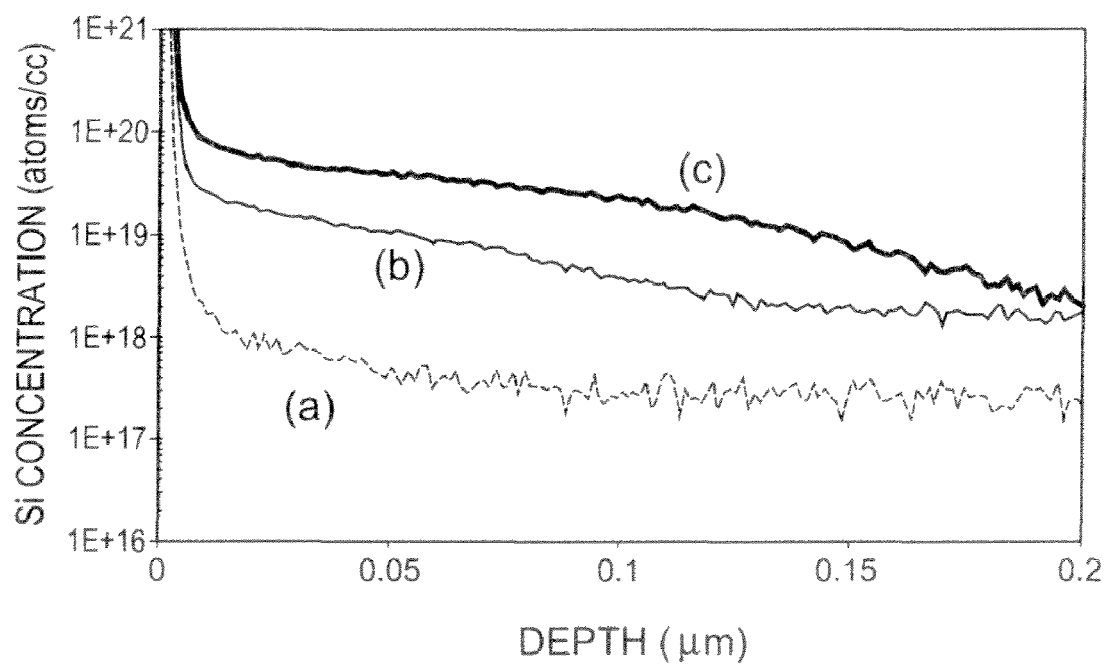
FIG. 1. Dynamic SIMS (secondary ion mass spectroscopy) Spectra for copper films pretreated with a hydrogen ($H_2$) plasma then exposed to (a) no seconds of 5% $SiH_4$ in nitrogen, (b) 10 seconds of 5% $SiH_4$ in nitrogen, and (c) 20 seconds of 5% $SiH_4$ in nitrogen, samples (b) and (c) were also post treated with an $NH_3$ plasma.

Copper adhesion to barrier layers and electromigration resistance are extremely important properties affecting device yield and device lifetimes. Currently the microelectronics industry is evaluating both silane exposure and electroless cobalt deposition to improve adhesion between the copper and the barrier dielectric layer. These are not optimal solutions as the silane treatments increase the copper resistivity which is a significant concern at the 32 nm generation and below, and the electroless cobalt deposition requires significant added steps to integrate.

The deposition of oxygen containing films directly onto copper generally does not result in highly adhesive interfaces due to the formation of copper oxide. Therefore dielectric barrier materials reported in the literature are generally silicon nitride or organosilicon carbonitride based materials, however, there is a desire in the microeletronics industry to use silicon oxide, organosilicon oxycarbide, organosilicon oxynitride, organosilicon carbonitride or organosilicon oxycarbonitride based films as barrier dielectrics because of their reduced dielectric constants. The method described in the present invention, that is, the use of certain volatile metallic materials as the adhesion promoter may allow for the deposition of oxygen-containing barrier films onto copper layers while retaining excellent adhesion properties. Metals under consideration are zinc, silver, chromium, tin, manganese, nickel, aluminum, and cobalt.

The organometallic precursor is selected from the group consisting of Tetramethyltin ($Me_4Sn$), dibutyldimethyltin, tributyltin hydride, tin hydride ($SnH_4$) and tin deuteride ($SnD_4$), Tetraalkyltin, trialkyltin hydride, dialkyltin dihydride, Alkylalkoxytin, Tetraalkoxytin, tetrakis(dialkylamino) tin, cyclopentadienyl cobalt dicarbonyl ($CpCo(CO)_2$), nitrosyl cobalt pentacarbonyl, cyclopentadienyl manganese tricarbonyl ($CpMn(CO)_3$), bis(ethylcyclopentadienyl)nickel ($(EtCp)_2Ni$), Diethylzinc ($Et_2Zn$), Diethylzinc-Trimethylamine adduct, Dimethylzinc, Dialkylzinc, amine adducts of Dialkylzinc, Nickel hexacarbonyl ($Ni(CO)_6$), Tungsten hexafluoride ($WF_6$), Chromium hexacarbonyl ($Cr(CO)_6$), trimethylaluminum, dimethylethylamine alane (DMEAA), and Tungsten hexacarbonyl ($W(CO)_6$).

A delivery apparatus for the organometallic precursors in the present invention includes any container designed for safety delivery. A typical container comprises an interior volume bounded by interior wall, an inlet, and an outlet.

The specific pressurized apparatus and method disclosed in U.S. Pat. No. 7,013,916 can also be used in the present invention. The entire disclosure of this United States patent is hereby incorporated by reference into this specification.

The organometallic precursor can be contained and delivered at sub-atmospheric pressure in a pressurized container, which includes (a) a valve body in sealed communication with an outlet orifice of the pressurized container, said outlet orifice of said pressurized container open to an interior chamber of said pressurized container;

(b) a fluid discharge path in the valve body, between the outlet orifice of the pressurized container and an outlet orifice of the valve body;

(c) a pressure regulator having a pressure sensing means capable of responding to sub-atmospheric pressure, integral to said valve body, in-line in the fluid discharge path, said pressure regulator pre-set to a pressure below atmospheric pressure to allow said gas to be delivered through said regulator from said interior chamber only when said pressure sensing means senses a downstream pressure at or below said pre-set pressure; and (d) a high pressure shut-off valve integral to said valve body, in-line in the fluid discharge path and upstream from said pressure regulator; whereby said gas may flow through from said interior chamber of said pressurized container through said fluid discharge path, through said outlet orifice of said pressurized container, and through said outlet orifice of said valve body only when said outlet orifice is connected to a vacuum system.

The deposition process used in the present invention can be any known process such as, Atomic Layer Deposition (ALD), Atomic Layer Treatment (ALT), Plasma Enhanced Atomic Layer Deposition (PEALD), Chemical Vapor Deposition (CVD), and Plasma Enhanced Chemical Vapor Deposition (PECVD), Low Pressure Chemical Vapor Deposition (LPCVD), Sub Atmospheric Chemical Vapor Deposition (SACVD), UV-assisted Chemical Vapor Deposition, Filament-assisted Chemical Vapor Deposition (FACVD), and Atmospheric Pressure Chemical Vapor Deposition (APCVD).

In the fabrication process, a direct liquid injection (DLI) delivery method can be employed. The precursor can be delivered by DLI of either a pure liquid precursor or by DLI of a mixture of the precursor with a solvent in a vessel or a container that is designed for the deposition delivery. A typical container comprises an interior volume bounded by interior wall, an inlet, and an outlet.

Organometallic precursors are vaporized either in the pure form or as mixtures, and the resulting precursor vapor, typically mixed with a carrier gas (such as argon, helium or nitrogen) is transported to a reactor, for example, a chemical vapor deposition (CVD) reactor.

More specifically, the organometallic precursor can comprise a solvent which solubilizes the organometallic precursor without decomposing it. The weight % of the solvent can be ranging from 5% to 99%; preferably 50% to 90%.

Suitable solvents can be the simple hydrocarbons of the basic formula $C_nH_{(2n+2-x)}$; where n is 3-10 and x is equal to the number of cyclic structures or the degrees of unsaturation; for example, hexane, hexadiene, pentane, heptane, cyclohexane, cyclooctane or an aromatic hydrocarbon of the general structure $C_6H_{(6-b)}R_b$, where R can be 0-6 and can be the same or different, for example toluene, mesytelene, xylene, paracymene and combinations thereof.

Some organometallic precursors may also be soluble in oxygen containing solvents such as ethers, for example diethyl ether, methyl isobutyl ether, or tetrahydrofuran, alcohols, for example methanol, ethanol, or isopropanol, ketones for example acetone, aldehydes, or esters.

Some of the advantages which may be available through the use of these solutions include the following:

lowering the flammability of the mixture by choosing a solvent with a flammability lower than the organometallic;

ability to delivery small amounts of organometallic precursor to the chamber using a dilute mixture;

lowering the concentration of a potentially toxic organometallic precursor by dilution;

an ability to tune the physical properties of the precursor solution such as viscosity for easy and safe delivery.

The deposition of oxygen containing films directly onto copper generally does not result in highly adhesive interfaces due to the formation of copper oxide. Therefore dielectric barrier materials reported in the literature are generally silicon nitride or organosilicon carbonitride based materials, however, there is a desire in the microeletronics industry to use silicon oxide, organosilicon oxycarbide, organosilicon oxynitride, organosilicon carbonitride or organosilicon oxycarbonitride based films as barrier dielectrics because of their reduced dielectric constants. The method described in the present invention, that is, the use of certain metallic materials, such as tin or zinc, as the adhesion promoter may allow for the deposition of oxygen-containing barrier films onto copper layers while retaining excellent adhesion properties. The dielectric barrier layer materials such as silicon nitride, silicon oxide, silicon carbide, silicon oxycarbide, silicon oxynitride, silicon carbonitride, silicon oxycarbonitride and mixtures are considered, where the "silicon" includes "organosilicon". For example, the list of materials includes organosilicon oxycarbide, organosilicon oxynitride, organosilicon carbonitride, organosilicon oxycarbonitride and mixtures. The barrier layer has a dielectric constant of less than 7. An example of dielectric barrier layer material is a $Si_3N_4$.

A consideration here is that the metal or the organometallic precursor should not negatively impact the dielectric materials exposed to the same processing. Examples of dielectric materials include silicon dioxide, fluorosilicate glass (FSG), organosilicate glass (OSG), aka carbon doped oxide (CDO), or porous low-k dielectric materials. Examples of low k dielectric materials used in the integration scheme include porous OSG (organosilicate glass) materials such as those deposited from PDEMS™ interlayer dielectric (ILD) deposition process. The low k dielectric materials usually have a dielectric constant of less than 3.0. The dielectric material has a dielectric constant of less than 3.2.

With the materials considered above together, a structure having improved conductive metal adhesion to a barrier layer and electromigration resistance is formed in the present invention. The structure comprises:

(a) at least one patterned dielectric layer with embedded conductive metal features(such as copper or copper alloys);

(b) an adhesion layer selectively deposited at least on the conductive metal features, said adhesion layer is selected from the group consisting of tin and zinc;

(c) a dielectric barrier layer covering the at least one patterned dielectric layer with embedded conductive metal features having the adhesion layer.

The structure can further have a metal barrier layer formed between the patterned dielectric layer and the embedded conductive metal features. The metal barrier layer comprises materials such as tantalum, tantalum nitride, titanium, titanium nitride, cobalt, rhuthenium, and other advanced barrier materials which prevent diffusion of the copper into the dielectric material.

WORKING EXAMPLES

The following examples are provided for the purpose of further illustrating the present invention but are by no means intended to limit the same.

In the following examples, film treatments were carried out on an Applied Materials Precision-5000 system equipped to process 200 mm silicon wafers. Thermal treatments were carried out in a D×L vacuum chamber, organometallic precursors were delivered to the chamber either by vapor draw or entrained with helium as a carrier gas. Plasma treatments and deposition of silicon nitride films were carried out in a D×L vacuum chamber that was fitted with an Advance Energy 200 rf generator. Adhesive energies were measured via 4-point bend using a DTS Company Delaminator instrument. Bulk film resistivity was measured on 100 nm thick copper films using a 4-point probe.

Silicon nitride cap layers were deposited using a standard $Si_3N_4$ deposition recipe: 100 sccm $NH_3$, 75 sccm $SiH_4$, 2000 sccm $N_2$, 3.5 torr chamber pressure, 400 mili-inch susceptor to wafer spacing, 300° C. wafer temperature, and 300 W power.

Organometallic precursors evaluated were tretramethyltin ($Me_4Sn$), cyclopentadienyl cobalt dicarbonyl ($CpCo(CO)_2$), cyclopentadienyl manganese tricarbonyl ($CpMn(CO)_3$), and bis(ethyl-cyclopentadienyl) nickel (($EtCp)_2Ni$).

Adhesion measurements are widely viewed as an acceptable surrogate measurement to predict performance in promoting electromigration resistance. Adhesion values were measured for copper films treated with various processes and capped with 400 nm of PEVCD $Si_3N_4$. 4-Point bend measurements were made by gluing a piece of silicon wafer on top of the $Si_3N_4$ film with epoxy, notching the top silicon wafer and using standard 4-point bend techniques. For examples 1 and 7 a 15 nm thick layer of chromium followed by a 150 nm thick layer of aluminum were deposited by sputtering onto both the silicon wafer and the Si3N4 in order to improve the adhesion strength of the epoxy.

In order to determine the adhesion value without any copper treatment a 400 nm thick layer of $Si_3N_4$ was deposited on top of a copper film that had not been treated, these films failed at the $Si_3N_4$/copper interface with a value of 4.0+/−0.5 $J/m^2$.

Example 1

Exposure of a Copper film to $H_2$ Plasma Pre-treatment

A series of films were exposed to 30 second hydrogen plasma to examine a baseline process for copper film pretreatment. In order to investigate the effect of a $H_2$ plasma on adhesion, a copper film was treated with a 30 second $H_2$ plasma followed by deposition of 400 nm of PECVD $Si_3N_4$.

Measurement of the adhesion with the 4-point bend technique revealed an adhesion value of 12.5 $J/m^2$.

To examine the impact of a $H_2$ plasma on the bulk resistivity of a copper film a 100 nm thick copper film with a bulk resistivity of 0.22 ohm-cm as measured by 4-point probe was exposed to a $H_2$ plasma for 30 seconds after which time the bulk resistivity was measured as 0.19 ohm-cm, this decrease is presumably due to the reduction of a thin copper oxide layer on top of the copper.

The data was summarized in Tables I and II.

Example 2

Exposure of a Porous OSG (Organosilicate Glass) (PDEMS™) to $H_2$ Plasma Pre-treatment In order to investigate the effect of a $H_2$ plasma on a porous organosilicate glass (OSG), a porous OSG PDEMS films were deposited by flowing a blend of diethoxymethylsilane (DEMS) and alpha terpinene into a vacuum chamber, striking a plasma to co-deposit an organosilicate glass (OSG) and a sacrificial organic porogen. This film is then annealed in using ultraviolet light to remove the sacrificial porogen to yield a porous OSG.

The porous OSG PDEMS films were then exposed to a 30 second $H_2$ plasma, this resulted in a increase in the dielectric constant from 2.2 to 2.4, a increase in leakage current from 8 pico-amperes to 168 pico-amperes, and a minor change in breakdown voltage from ~4 to 3.75 MV/m.

The data was summarized in Table III.

Example 3

Exposure of a copper film to $H_2$ plasma Pre-treatment, $SiH_4$ in nitrogen and $NH_3$ plasma post-treatment A series of films were exposed to a 30 second hydrogen plasma pre-treatment, followed by exposure to a mixture of 5% $SiH_4$ in nitrogen at 4.5 torr for a variable amount of time, and finally to a $NH_3$ plasma for 30 seconds post-treatment as shown below, in order to examine a baseline process for copper treatment.
1) $H_2$ plasma pre-treat to reduce CuO
   300 sccm $H_2$, 2.7 torr, 400 mil spacing, 3000° C., at 300 W for 30 seconds
2) $SiH_4$ exposure
   2000 sccm $N_2$, 100 sccm $SiH_4$, 4.5 Torr, 300° C. for a variable length of time
3) $NH_3$ plasma post treatment
   200 sccm $NH_3$, 4.5 Torr, 300 mil, 3000° C., at 300 W for 30 seconds
4) This may or may not have been followed with a $Si_3N_4$ capping layer.

To examine the impact of the silane treatment on the bulk resistivity of a copper film a 100 nm thick copper film with a bulk resistivity of 0.21 ohm-cm as measured by 4-point probe was exposed to the silane treatment for 5 and 10 seconds with $H_2$ plasma pre treatment and a $NH_3$ plasma post treatment after which time the bulk resistivity was measured as 0.40 and 0.47 ohm-cm respectively. This sharp increase is believed to be due to silicon diffusing into the copper.

Similar samples with a thicker copper film were prepared and submitted for dynamic SIMS (secondary ion mass spectroscopy), the results of this analysis as well as that for a standard copper film exposed only to $H_2$ plasma treatment are shown in FIG. 1, it is evident that as the silane exposure times increased the amount of and depth of silicon diffusion also increased.

The data was summarized in Table II.

Example 4

Exposure of a Copper Film to $H_2$ Plasma Pre-treatment, tetremethyltin($Me_4Sn$), Without Post Exposure Treatment Measurement of the adhesion between a copper film which had been exposed to a $H_2$ plasma pre-treatment, followed by a 10 second exposure to an organometallic precursor: 9% $Me_4Sn$ in He at 4.5 Torr and 300° C. then capped with a 400 nm film of PECVD $Si_3N_4$ was measured with the 4-point bend technique which yielding an adhesion value of 6.3+/−1 $J/m^2$ with delamination occurring at the copper/$Si_3N_4$ interface. This indicates no improvement in adhesion relative to the untreated copper film. The data was summarized in Table I.

Example 5

Exposure of a Porous OSG to Tetremethyltin($Me_4Sn$)

In order to investigate the effect of a $Me_4Sn$ exposure on a porous organosilicate glass (OSG), the porous OSG deposited as described in Example 2 was exposed to an organometallic precursor: 9% mixture of $Me_4Sn$ in helium at 3000° C. for 20 seconds, this resulted in a increase in the dielectric constant from 2.2 to 2.3, a minor change in leakage current from ~8 pico-amperes to 7 pico-amperes, and a minor change in breakdown voltage from ~4 to 4.18 MV/m.

The last measurement was also repeated for the exposure to $Me_4Sn$ after a 30 second $H_2$ plasma treatment.

Compared to the values measured above for a porous OSG PDEMS™ film exposed just to a $H_2$ plasma treatment (Example 2), further exposure to 20 seconds of $Me_4Sn$ resulted in a minor change in the dielectric constant from 2.5 to 2.4, a minor change in leakage current from 166 pico-amperes to 230 pico-amperes, and a minor change in breakdown voltage from 3.76 to 3.62 MV/m. The data was summarized in Table III.

Example 6

Exposure of a Copper Film to $H_2$ Plasma Pre-treatment, tetremethyltin ($Me_4Sn$) and $H_2$ Plasma Post-treatment Measurement of the adhesion between a sample which had been exposed to a $H_2$ plasma followed by a 10 second exposure to 9% $Me_4Sn$ in He then treated with a $H_2$ plasma post treatment and capped with a 400 nm film of PECVD $Si_3N_4$ was measured with the 4-point bend technique described previously which yielded an adhesion value of 22.0 $J/m^2$. The delamination occurred at the copper/$Si_3N_4$ interface.

To examine the impact of the this $Me_4Sn$ treatment on the bulk resistivity of a copper film 100 nm thick copper films with bulk resistivities of 0.22 and 0.20 ohm-cm as measured by 4-point probe were exposed to the $Me_4Sn$ treatment for 10 and 20 seconds with $H_2$ plasma pre and post treatments after which time the bulk resistivity was measured as 0.18 and 0.17 ohm-cm respectively, this decrease in resistivity is believe to be due to a combination of (1) reduction of the CuO layer with the $H_2$ plasma pretreatment and (2) a relatively low resistivity of the thin adhesion layer deposited by the $Me_4Sn$.

The data was summarized in Table I and II.

Similar samples with a thicker copper film were prepared and submitted for dynamic SIMS (secondary ion mass spectroscopy), these films were treated with a 20 second exposure to 9% $Me_4Sn$ in helium with pre and post $H_2$ plasma treatments then capped with a 400 nm thick PECVD $Si_3N_4$ layer.

Figure 2:
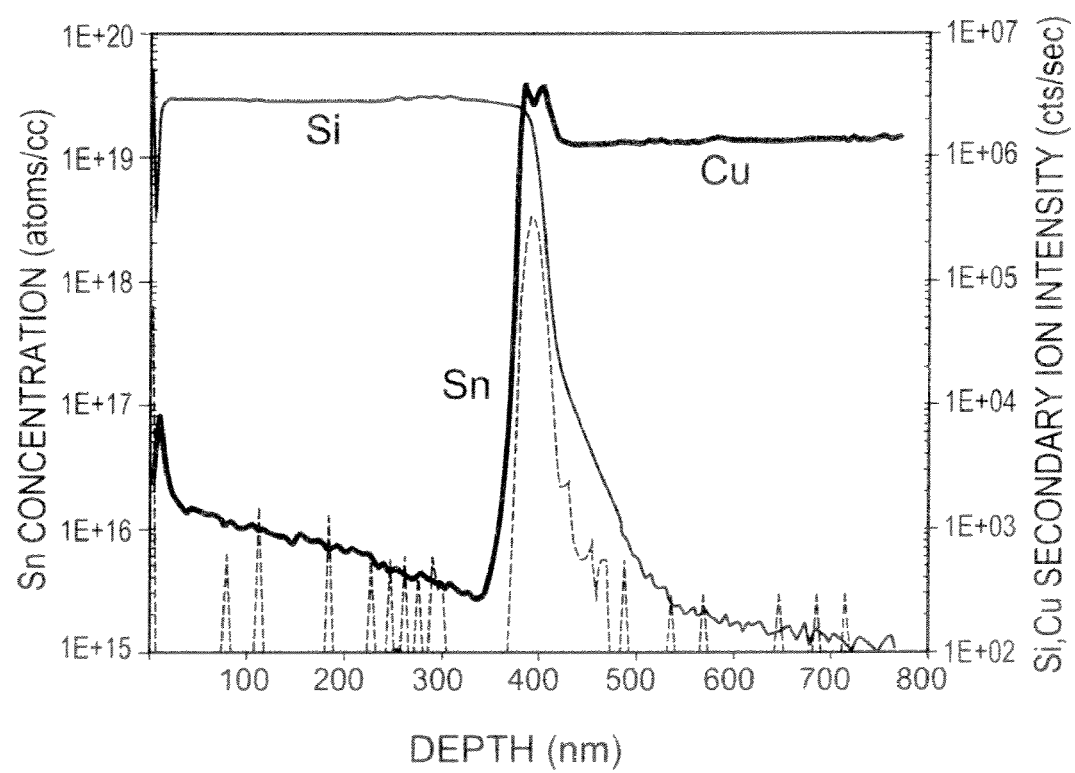
FIG. 2. Dynamic SIMS (secondary ion mass spectroscopy) data for a copper film pretreated with a hydrogen ($H_2$) plasma, then exposed to 20 seconds of 9% $Me_4Sn$ in helium, post treated with a $H_2$ plasma then capped with 400 nm of PECVD (Plasma Enhanced Chemical Vapor Deposition) $Si_3N_4$ FIG. 3. Dynamic SIMS (secondary ion mass spectroscopy) data for a copper film pretreated with a hydrogen ($H_2$) plasma, then exposed to 20 seconds of $CpCo(CO)_2$, post treated with hydrogen ($H_2$) plasma then capped with 400 nm of PECVD $Si_3N_4$.

The result of the analysis is shown in FIG. 2. It is evident that the $Me_4Sn$ exposure results in the deposition of a thin tin containing layer at the interface between the copper and the $Si_3N_4$.

A set of wafers were obtained on which patterned Black Diamond™ organosilicate glass films were filled with copper metal, these patterned features included Kelvin structures of varying line widths (0.14-0.18 microns) to measure copper line resistance and comb-serpintene structures (0.16×0.18 microns) to evaluate leakage current and electrical shorting. These wafers were first treated with a hydrogen plasma at 350 C for 20 seconds to reduce the surface copper oxide, these were then exposed to tetramethyl tin for 30 seconds at 350 C followed by a second hydrogen plasma to remove residual carbon from the surface. These wafers were then electrically probed to test for leakage current and electrical shorts as well as measuring copper line resistance. Testing of the Kelvin structures revealed that the copper line resistance was not increased by treatment with tetramethyl tin which indicates that the treatment with tetramethyl tin results in only a surface treatment, if the tin had diffused into the copper an increase in copper resistance would have been observed. Testing of the Comb-Serpentine structures revealed that the treatment with tetramethyl tin does not increase the line to line leakage current and no electrical shorts were observed indicating that the tetramethyl tin treatment does not deposit a conductive layer of tin on the Organosilicate Glass supporting the fact of selective treatment of the copper surface with tetramethyl tin. Additionally there was no increase in capacitance between metals lines which indicates that the tetramethyl tin treatment does not damage the organosilicate glass.

Example 7

Exposure of a Copper Film to $H_2$ Plasma Pre-treatment, Cyclopentadienyl Cobalt Dicarbonyl ($CpCo(CO)_2$) and $H_2$ Plasma Post-treatment Measurement of the adhesion between a sample which had been exposed to a $H_2$ plasma followed by a 10 second exposure to vapors of $CpCo(CO)_2$ at 3000° C. then treated with a $H_2$ plasma post treatment and capped with a 400 nm film of PECVD $Si_3N_4$ was measured with the 4-point bend technique yielding an adhesion value of 17.5 $J/m^2$, however, the delamination occurred between the top of the $Si_3N_4$ and the bare silicon used in the 4-point bend technique, therefore the adhesion strength of the copper/Si3N4 interface could not be unambiguously measured.

The data was summarized in Table I.

Figure 3:
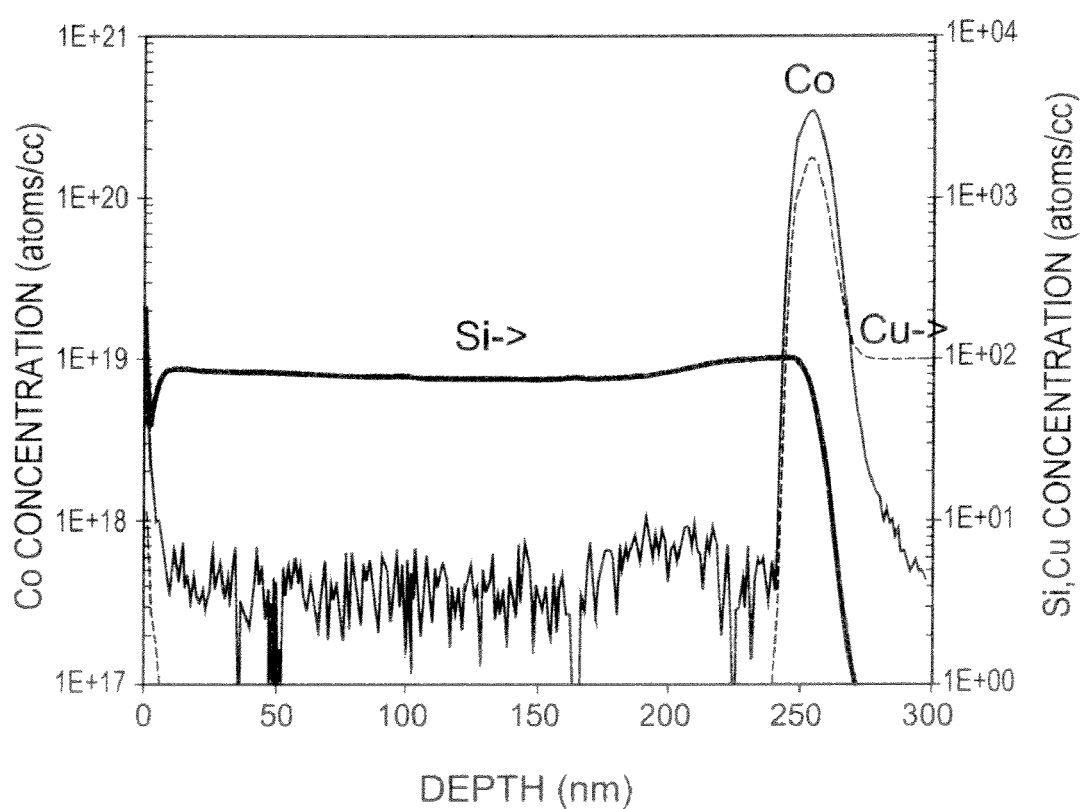

Similar samples with a copper film exposed to the cobalt treatment were prepared and submitted for dynamic SIMS (secondary ion mass spectroscopy), these films were treated with a 20 second exposure to $CpCo(CO)_2$ vapors at 3000° C. with pre and post $H_2$ plasma treatments then capped with a 400 nm thick PECVD $Si_3N_4$ layer. The result of the analysis is shown in FIG. 3. It is evident that the $CpCo(CO)_2$ exposure results in the deposition of a thin cobalt containing layer at the interface between the copper and the $Si_3N_4$.

Example 8

Exposure of a Copper Film to $H_2$ Plasma Pre-treatment, Cyclopentadienyl Manganese Triicarbonyl ($CpMn(CO)_3$) and $H_2$ Plasma Post-treatment Measurement of the adhesion between a sample which had been exposed to a $H_2$ plasma followed by a 10 second exposure to vapors of $CpMn(CO)_3$ at 3000° C. then treated with a $H_2$ plasma post treatment and capped with a 400 nm film of PECVD $Si_3N_4$ was measured with the 4-point bend technique yielding an adhesion value of 21.9+/−2.3 $J/m^2$, however, the delamination occurred between the top of the $Si_3N_4$ and the bare silicon used in the 4-point bend technique, therefore the adhesion strength of the copper/Si3N4 interface could not be unambiguously measured. The data was summarized in Table I.

Similar samples with a copper film exposed to the manganese treatment were prepared and submitted for dynamic SIMS (secondary ion mass spectroscopy), these films were treated with a 20 second exposure to $CpMn(CO)_3$ vapors at 3000° C. with pre and post $H_2$ plasma treatments then capped with a 400 nm thick PECVD $Si_3N_4$ layer.

Figure 4:
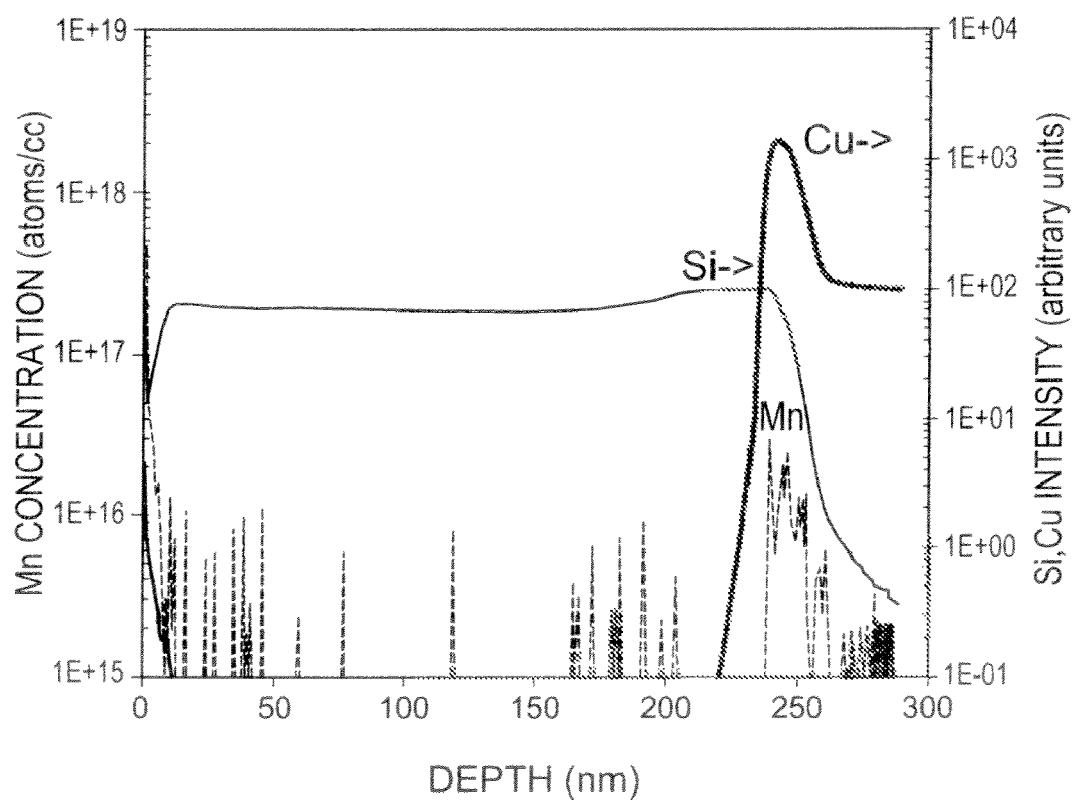
FIG. 4. Dynamic SIMS (secondary ion mass spectroscopy) data for a copper film pretreated with a hydrogen ($H_2$) plasma, then exposed to 20 seconds of $CpMn(CO)_3$, post treated with a hydrogen ($H_2$) plasma then capped with 400 nm of PECVD $Si_3N_4$.

The result of the analysis is shown in FIG. 4. It is evident that the $CpMn(CO)_3$ exposure results in the deposition of a thin manganese containing layer at the interface between the copper and the $Si_3N_4$.

Example 9

Exposure of a Copper Film to $H_2$ Plasma Pre-treatment, Bis(ethylcyclopentadienyl)Nickel ($EtCp_2Ni$) with $H_2$ Plasma Post-treatment Measurement of the adhesion between a sample which had been exposed to a $H_2$ plasma followed by a 10 second exposure to vapors of $EtCp_2Ni$ at 300° C. then treated with a $H_2$ plasma post treatment and capped with a 400 nm film of PECVD $Si_3N_4$ was measured with the 4-point bend technique yielding an adhesion value of 31.5 $J/m^2$, however, the delamination occurred between the top of the $Si_3N_4$ and the bare silicon used in the 4-point bend technique, therefore the adhesion strength of the copper/Si3N4 interface could not be unambiguously measured.

The data was summarized in Table I.

Similar samples with a copper film exposed to the manganese treatment were prepared and submitted for dynamic SIMS (secondary ion mass spectroscopy), these films were treated with a 20 second exposure to $EtCp_2Ni$ vapors at 3000° C. with pre and post $H_2$ plasma treatments then capped with a 400 nm thick PECVD $Si_3N_4$ layer.

Figure 5:
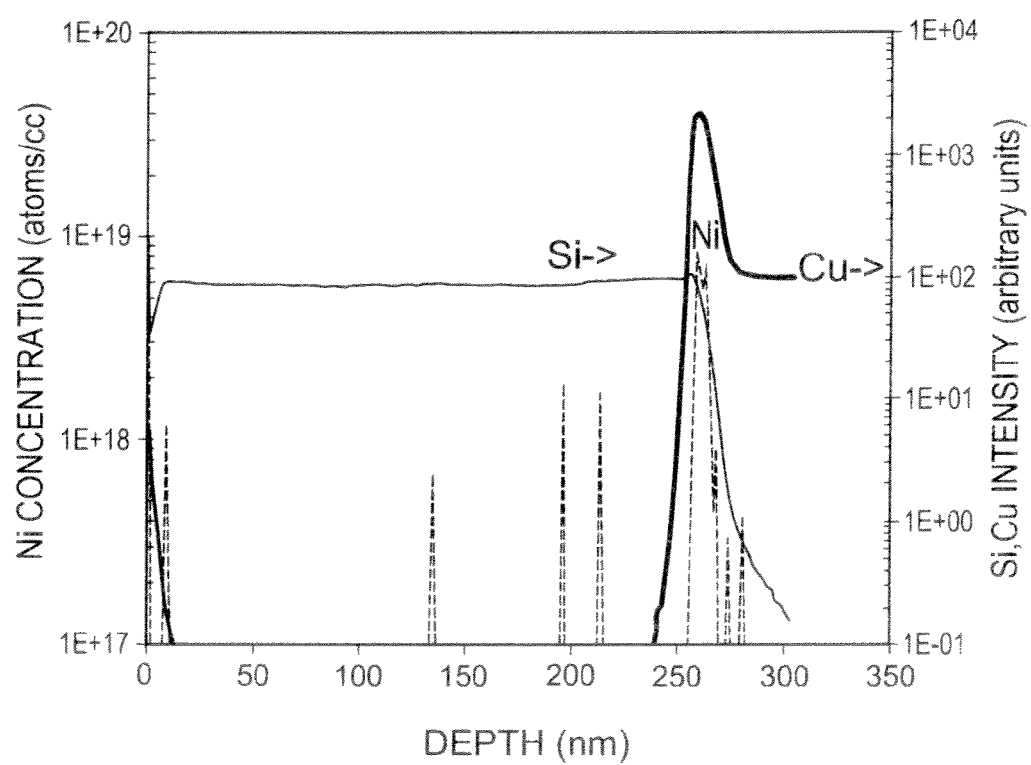
FIG. 5. Dynamic SIMS (secondary ion mass spectroscopy) data for a copper film pretreated with a hydrogen ($H_2$) plasma, then exposed to 20 seconds of $EtCp_2Ni$, post treated with a hydrogen ($H_2$) plasma then capped with 400 nm of PECVD $Si_3N_4$.

The result of the analysis is shown in FIG. 5. It is evident that the $EtCp_2Ni$ exposure results in the deposition of a thin nickel containing layer at the interface between the copper and the $Si_3N_4$.

The data from above measurements are summarized in Table I.

TABLE I

Effect of Process on Adhesion between PECVD $Si_3N_4$ and Copper

| Process | Adhesion (J/m²) |
| --- | --- |
| Untreated Film | 4 +/− 0.5 |
| $H_2$ Treatment | 12.5 |
| $Me_4Sn$ with out Post | 6.3 +/− 1.0 |
| 20 second $Me_4Sn$ with $H_2$ Post | 22.0 |
| $CpMn(CO)_3$ with $H_2$ Post | 21.9 +/− 2.3 |
| $(EtCp)_2Ni$ with $H_2$ post | 31.5 |
| $CpCo(CO)_2$ with $H_2$ post | 17.5 |

Table I shows the effect of various processes on the adhesion between the copper layer and the capping PECVD deposited $Si_3N_4$. These measurements were carried out by the industry standard 4-point bend technique. Unless otherwise noted all films were pretreated with a hydrogen plasma.

The untreated copper film shows a low adhesion value of 4+/0.5 J/m² with delamination at the $Si_3N_4$ to copper interface due to the poor adhesion to the native oxide found on copper films. Treatment with hydrogen plasma will reduce the copper oxide back to copper metal and an adhesion value of 12.5 J/m² is measured with failure observed between the $Si_3N_4$ and the copper interface.

Treatment of the copper with a hydrogen plasma followed by a 10 second exposure to $Me_4Sn$ with no post treatment followed by capping with a PECVD $Si_3N_4$ layer results in an adhesion value of 6.3 J/m² with delamination at the $Si_3N_4$ to copper interface which is believed to be due to residual carbon at the surface after treatment with the $Me_4Sn$. Treatment with hydrogen plasma after exposure the $Me_4Sn$ improves adhesion dramatically and an adhesion value of 22.0 J/m2 is observed with delamination occurring at the Si3N4/copper interface. Copper films treated with cyclopentadienylmanganese tricarbonyl, bis(ethylcyclopentadienyl)nickel, and cyclopentadienylcobalt dicarbonyl vapors followed by a hydrogen plasma treatment were not examined with the advanced 4-point bend technique in which chromium and aluminum layer deposition and thus delamination occurred at the epoxy interface which indicates good adhesion although accurate measurements were not possible.

TABLE II

Effect of copper treatments on bulk copper resistivity

| Treatment | Resistivity before treatment ($10^{-3}$ ohm-cm) | Resistivity after treatment ($10^{-3}$ ohm-cm) | Change in resistivity (%) |
| --- | --- | --- | --- |
| $H_2$ plasma only | 224 +/− 4 | 186 +/− 4 | −17 |
| $NH_3$ plasma only | 182 +/− 2 | 167 +/− 2 | −8 |
| $H_2$ plasma/5 second $SiH_4$/$NH_3$ plasma | 214 +/− 4 | 402 +/− 30 | 89 |
| $H_2$ plasma/10 second $SiH_4$/$NH_3$ plasma | 210 +/− 4 | 466 +/− 26 | 122 |
| $H_2$ plasma/10 second $Me_4Sn$/$H_2$ plasma | 221 +/− 4 | 185 +/− 1 | −16 |
| $H_2$ plasma/20 second $Me_4Sn$/$H_2$ plasma | 200 +/− 8 | 174 +/− 6 | −13 |

Table II shows the effect of various copper treatments on the bulk resistivity of a 100 nm thick copper film as measured by 4-point probe before and after treatment. All treatments were carried out at 300° C. Exposure of the copper films to just hydrogen or ammonia plasmas lower the bulk resistivity by 8 to 17% presumably due to reduction of the native copper oxide layer found on top of the untreated films. Exposure of the copper to either 5 or 10 seconds of $SiH_4$ in the "standard silane process" results in significant bulk resistivity increases of 89 and 122% respectively, presumably due to formation of CuSiN and diffusion of Si into the bulk of the copper. Exposure of the copper layer to $Me_4Sn$ for either 10 or 20 seconds with pre and post hydrogen plasma treatments results in decrease the bulk resistivity by 16 and 13% respectively. These changes are similar to those measured for just hydrogen plasma only treatments, which indicates that the layer which is deposited from the $Me_4Sn$ exposure does not significantly impact the copper resistivity as is seen with silane exposure.

TABLE III

Effect of $Me_4Sn$ treatment on porous OSG films (PDEMS ™)

| Treatment | Dielectric Constant | Leakage Current (pA) | Breakdown Voltage (MV/m) |
| --- | --- | --- | --- |
| Untreated | ~2.2 | ~8 | ~4 |
| 10 second $Me_4Sn$ | 2.28 | 7 | 4.18 |
| $H_2$ plasma only | 2.46 | 166 | 3.75 |
| $H_2$ plasma/10 second $Me_4Sn$ | 2.44 | 137 | 3.62 |
| $H_2$ plasma/20 second $Me_4Sn$ | 2.44 | 230 | 3.62 |

Table III shows the effect of $Me_4Sn$ on the electrical performance of porous organosilicate films such as those produced by PDEMS™ ILD deposition process with a dielectric constant of ~2.2. This experiment was performed to determine if the $Me_4Sn$ would diffuse into the pores of a porous OSG potentially degrading the electrical performance of the porous OSG. A PDEMS™ film with a measured dielectric constant of ~2.2 was exposed to $Me_4Sn$ for 10 seconds at 300° C. The dielectric constant, leakage current and breakdown voltages are either unaffected or only minimally effected by exposure to the $Me_4Sn$. These measurements were also run after exposure of the PDEMS™ to a hydrogen plasma and the values are given, the hydrogen plasma results in a increase in dielectric constant and leakage current. Exposure of the hydrogen plasma treated films to $Me_4Sn$ for 10 and 20 seconds does not significantly affect the dielectric constant or breakdown voltage. There is a measured difference in leakage current upon exposure to the $Me_4Sn$, however, we do not believe that the measured differences are significant.

Example 10

Measurement of Tin Deposited on the Copper Film

This example repeated the same measurement as set in Example 7, but with various exposure times and temperatures.

Samples of copper films were first in-situ plasma treated with a $H_2$ plasma to reduce the surface copper oxide (pre-treatment), after which the samples were exposed to tetremethyltin ($Me_4Sn$) as a 9% mixture in helium for various exposure times and temperatures. The samples were once again exposed to a $H_2$ plasma to remove surface carbon (post-treatment). Samples were then submitted for surface X-ray photoelectron spectroscopy (XPS) analysis to measure the Tin on the copper films. The percent tin was measured as a ratio relative to copper.

Table IV shows that for all exposures only a small amount of tin was deposited, if it is assumed that a monolayer of tin would be result in a XPS signal of 5 atomic % these samples have slightly less than a monolayer of tin on the surface. The observation that a film exposed for 20 seconds and a film exposed for 80 seconds had essentially the same level of tin indicates that this is a surface limited reaction and not a continual deposition reaction. This is further indicated by the samples which was exposed at 350 C which also showed essentially the same level of tin indicating that the deposition is not thermally driven.

TABLE IV

| Process | % Sn/Cu by XPS |
|---|---|
| 20 second exposure to Me4Sn at 300 C. | 1.4 |
| 80 second exposure to Me4Sn at 300 C. | 0.8 |
| 20 second exposure to Me4Sn at 350 | 1.1 |

Next, three samples of copper films were first treated with a $H_2$ plasma, then exposed to $Me_4Sn$ for 20 seconds followed by a $H_2$ plasma. The above whole process was repeated 5 times and 10 times respectively on two of the three samples. The samples were then submitted for surface X-ray photoelectron spectroscopy (XPS) analysis to measure the tin on the copper surface. The percent tin was measured as a ration relative to copper.

Figure 6:
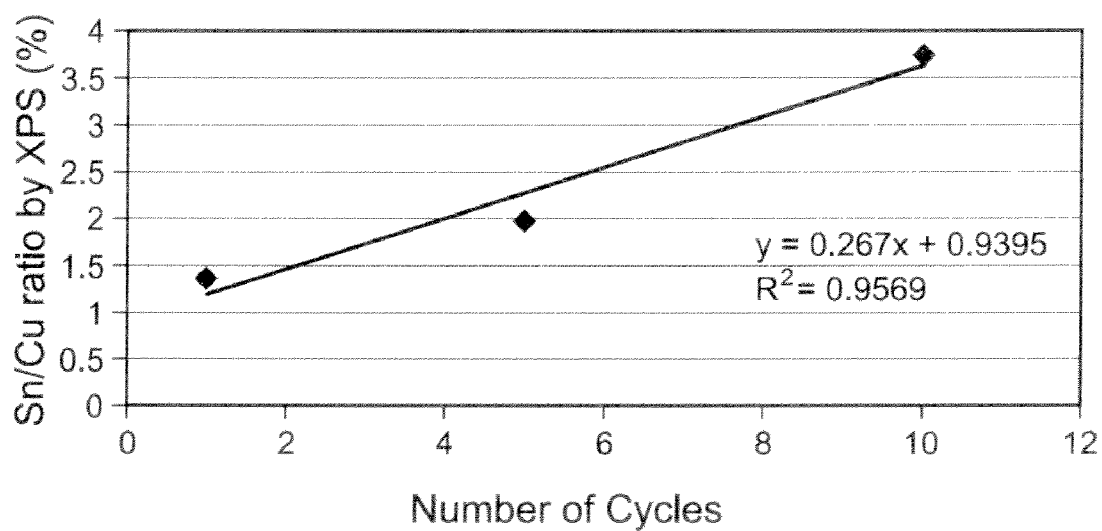
FIG. 6. X-ray photoelectron spectroscopy (XPS) data for the amount of tin at the copper surface presented as a ratio of Sn/Cu (%).

As shown in FIG. 6, the amount of tin increased from 1.4%, to 2.0% and finally 3.4% for one, five and ten process cycles, respectively. The whole process can be repeated until a desired thickness of the tin on the copper surface is achieved. This indicates that the ALD process can also be used to deposit tin onto the copper surface.

Samples of wafers with PDEMS and $Si_3N_4$ films on them were exposed to the same process described above for five cycles. Then, the sample was submitted for surface X-ray photoelectron spectroscopy (XPS) analysis to measure the Tin on the surfaces of PDEMS and $Si_3N_4$ films. There was no tin observed above the detection limit of the XPS, indicating that the $Me_4Sn$ process is a selective deposition process.

Example 11

Exposure of a Copper Film to $H_2$ Plasma Pre-treatment, Tetramethyl Tin/Anhydrous Hexane Mixture with $NH_3$ Plasma Post-treatment A mixture of 5 mL tetramethyl tin along with 95 mL anhydrous hexane was prepared in a drybox. This mixture was then delivered to the CVD chamber by means of direct liquid injection of the mixture with a vaporization temperature of 50° C.

Copper films were first treated with a $H_2$ plasma to reduce the copper oxide followed by exposure of the film to vapors of the tetramethyl tin/hexane mixture at 350° C. for 30 seconds after which time the films were post-treated with a $NH_3$ plasma and finally coated with a Silicon carbon nitride film.

Analysis of the resulting film stack by x-ray photoelectron spectroscopy shows a clean metallic tin layer at the copper/silicon carbonitride interface. The use of a solvent such as hexane which does not influence the tin treatment offers advantages in safety and handling.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A method for improving adhesion of a semiconductor device comprising steps of:
   (a) providing a substrate in a processing chamber; wherein the substrate comprises at least one patterned dielectric layer and at least one patterned conductive metal layer;
   (ab) exposing the substrate to a pre-treatment; and
   (b) introducing an organometallic precursor to the processing chamber to selectively deposit an adhesion layer on the at least one patterned conductive metal layer;
   wherein
   the organometallic precursor is selected from the group consisting of: organozinc, organosilver, organochromium, organotin, organomanganese, organonickel, organocobalt, organoaluminum, and mixtures thereof; and
   steps (ab) and (b) are repeated until a desired thickness of the adhesion layer is achieved.

2. The method in claim 1, wherein the pre-treatment is selected from the group consisting of $H_2$ plasma, $NH_3$ plasma, $H_2$/He plasma, $H_2/N_2$ plasma and mixtures thereof.

3. The method in claim 1 further comprising a step (c) depositing a dielectric barrier layer on the substrate having the adhesion layer.

4. The method in claim 3 further comprising a step before (c):
   exposing the substrate having the adhesion layer to a post-treatment.

5. The method in claim 3, wherein the dielectric barrier layer is selected from the group consisting of: silicon nitride, silicon oxide, silicon oxycarbide, silicon oxynitride, silicon carbonitride, silicon oxycarbonitride, silicon carbide, and mixtures thereof.

6. The method of claim 3 wherein the dielectric barrier layer has a dielectric constant of less than 7.

7. The method in claim 4, wherein the post-treatment is selected from the group consisting of $H_2$ plasma, $NH_3$ plasma, $H_2$/He plasma, $H_2/N_2$ plasma and mixtures thereof.

8. The method in claim 1, wherein the organometallic precursor is solubilized in a solvent selected from the group consisting of a hydrocarbon with formula $C_nH_{(2n+2-x)}$; where n is 3-10 and x is equal to the number of cyclic structures or the degrees of unsaturation; an oxygen containing solvents; and mixtures thereof;
   wherein the solvent solubilizes the organometallic precursor without decomposing the organometallic precursor.

9. The method in claim 8, wherein weight % of the solvent ranges from 5% to 99%.

10. The method in claim 8, wherein weight % of the solvent ranges from 50% to 90%.

11. The method in claim 8, wherein the oxygen containing solvent is selected from the group consisting of an ester, an alcohol, and mixtures thereof.

12. The method in claim 8, wherein the hydrocarbon is selected from the group consisting of hexane, hexadiene, pentane, heptane, cyclohexane, cyclooctane, an aromatic hydrocarbon of the general structure $C_6H_{(6-b)}R_b$, wherein R is 0-6, and mixtures thereof.

13. The method in claim 12, wherein the aromatic hydrocarbon is selected from the group consisting of toluene, mesytelene, xylene, para-cymene and mixtures thereof.

14. The method in claim 1, wherein the organometallic precursor is contained and delivered in a container comprising an interior volume bounded by interior wall, an inlet, and an outlet.

15. The method in claim 1, wherein the organometallic precursor is contained and delivered at sub-atmospheric pressure in a pressurized container, comprising
(a) a valve body in sealed communication with an outlet orifice of the pressurized container, said outlet orifice of said pressurized container open to an interior chamber of said pressurized container;
(b) a fluid discharge path in the valve body, between the outlet orifice of the pressurized container and an outlet orifice of the valve body;
(c) a pressure regulator having a pressure sensing means capable of responding to sub-atmospheric pressure, integral to said valve body, in-line in the fluid discharge path, said pressure regulator pre-set to a pressure below atmospheric pressure to allow said gas to be delivered through said regulator from said interior chamber only when said pressure sensing means senses a downstream pressure at or below said pre-set pressure; and
(d) a high pressure shut-off valve integral to said valve body, in-line in the fluid discharge path and upstream from said pressure regulator; whereby said gas may flow through from said interior chamber of said pressurized container through said fluid discharge path, through said outlet orifice of said pressurized container, and through said outlet orifice of said valve body only when said outlet orifice is connected to a vacuum system.

16. The method of claim 1 wherein the at least one patterned dielectric layer is selected from the group consisting of silicon dioxide, fluorosilicate glass (FSG), organosilicate glass (OSG), carbon doped oxide (CDO), a porous organosilicate glass having a dielectric constant of less than 3.0, and mixtures thereof.

17. The method of claim 1 wherein the at least one patterned dielectric layer has a dielectric constant of less than 3.2.

18. The method in claim 1, wherein the at least one patterned conductive metal layer is selected from the group consisting of copper, copper alloys and mixtures thereof.

19. The method in claim 1, wherein the organometallic precursor is selected from the group consisting of tetramethyltin ($Me_4Sn$), dibutyldimethyltin, tributyltin hydride, tetraalkyltin, trialkyltin hydride, dialkyltin dihydride, alkylalkoxytin, tetraalkoxytin, tetrakis(dialkylamino)tin, tin hydride ($SnH_4$), tin deuteride ($SnD_4$), cyclopentadienyl cobalt dicarbonyl ($CpCo(CO)_2$), nitrosyl cobalt pentacarbonyl, cyclopentadienyl manganese tricarbonyl ($CpMn(CO)_3$), bis(ethylcyclopentadienyl)nickel (($EtCp)_2Ni$), diethylzinc ($Et_2Zn$), diethylzinc-trimethylamine adduct, dimethylzinc, dialkylzinc, amine adducts of dialkylzinc, nickel hexacarbonyl ($Ni(CO)_6$), tungsten hexafluoride ($WF_6$), chromium hexacarbonyl ($Cr(CO)_6$), trimethylaluminum, dimethylethylamine alane (DMEAA), tungsten hexacarbonyl ($W(CO)_6$), and mixtures thereof.

20. The method in claim 1, wherein the adhesion layer is deposed by a process selected from the group consisting of Atomic Layer Deposition (ALD), Plasma Enhanced Atomic Layer Deposition (PEALD), Chemical Vapor Deposition (CVD), and Plasma Enhanced Chemical Vapor Deposition (PECVD), Low Pressure Chemical Vapor Deposition (LPCVD), Sub Atmospheric Chemical Vapor Deposition (SACVD), UV-assisted Chemical Vapor Deposition, Filament-assisted Chemical Vapor Deposition (FACVD), and Atmospheric Pressure Chemical Vapor Deposition (APCVD).

21. The method in claim 1, wherein the adhesion layer is selected from the group consisting of tin and zinc.

22. The method of claim 1, wherein the adhesion layer is tin.

23. A method for processing a semiconductor device having an improved adhesion comprising steps of:
(a) providing a substrate in a processing chamber;
wherein the substrate comprises at least one patterned dielectric layer and at least one patterned conductive metal layer;
(b) exposing the substrate to a pre-treatment;
(c) introducing an organotin precursor to the processing chamber to selectively deposit an adhesion layer on the at least one patterned conductive metal layer after the pre-treatment in (b);
(d) exposing the substrate having the adhesion layer to a post-treatment; and
(e) depositing a dielectric barrier layer on the substrate having the adhesion layer after the post-treatment in (d).

24. The method in claim 23, wherein steps (b), (c) and (d) are repeated until a desired thickness of the adhesion layer is achieved.

25. The method in claim 23, wherein
the at least one patterned dielectric layer is selected from the group consisting of silicon dioxide, fluorosilicate galss (FSG), organosilicate glass (OSG), carbon doped oxide (CDO), a porous organosilicate glass having a dielectric constant of less than 3.0, and mixtures thereof;
the at least one patterned conductive metal layer is selected from the group consisting of copper, copper alloys, and mixtures thereof;
the pre-treatment and the post-treatment are both $H_2$ plasma; and
the organotin precursor is selected from the group consisting of Tetramethyltin ($Me_4Sn$), dibutyldimethyltin, tributyltin hydride, tetraalkyltin, trialkyltin hydride, dialkyltin dihydride, alkylalkoxytin, tetraalkoxytin, tetrakis(dialkylamino)tin, tin hydride ($SnH_4$), tin deuteride ($SnD_4$), and mixtures thereof.

26. The method in claim 23, wherein the organotin precursor is Tetramethyltin ($Me_4Sn$).

27. The method in claim 23, wherein the adhesion layer is deposed by a process selected from the group consisting of Atomic Layer Deposition (ALD), Plasma Enhanced Atomic Layer Deposition (PEALD), Chemical Vapor Deposition (CVD), and Plasma Enhanced Chemical Vapor Deposition (PECVD), Low Pressure Chemical Vapor Deposition (LPCVD), Sub Atmospheric Chemical Vapor Deposition (SACVD), UV-assisted Chemical Vapor Deposition, Filament-assisted Chemical Vapor Deposition (FACVD), and Atmospheric Pressure Chemical Vapor Deposition (APCVD).

28. The method in claim 23, wherein the organotin precursor is solubilized in a solvent selected from the group consisting of a hydrocarbon with formula $C_nH_{(2n+2-x)}$; where n is 3-10 and x is equal to the number of cyclic structures or the degrees of unsaturation; an oxygen containing solvents; and mixtures thereof;
wherein the solvent solubilizes the organometallic precursor without decomposing the organometallic precursor.

29. The method in claim 28, wherein weight % of the solvent ranges from 5% to 99%.

30. The method in claim 28, wherein weight % of the solvent ranges from 50% to 90%.

31. The method in claim 28, wherein the oxygen containing solvent is selected from the group consisting of an ester, an alcohol, and mixtures thereof.

32. The method in claim 28, wherein the hydrocarbon is selected from the group consisting of hexane, hexadiene, pentane, heptane, cyclohexane, cyclooctane, an aromatic hydrocarbon of the general structure $C_6H_{(6-b)}R_b$, wherein R is 0-6; and mixtures thereof.

33. The method in claim 32, wherein the aromatic hydrocarbon is selected from the group consisting of toluene, mesytelene, xylene, para-cymene and mixtures thereof.

34. The method in claim 28, wherein the organotin precursor is tetramethyltin ($Me_4Sn$) solubilized in hexane.

35. The method in claim 21, wherein the organometallic precursor is contained and delivered in a container comprising an interior volume bounded by interior wall, an inlet, and an outlet.

36. The method in claim 23, wherein the organotin precursor is contained and delivered at sub-atmospheric pressure in a pressurized container, comprising
   (a) a valve body in sealed communication with an outlet orifice of the pressurized container, said outlet orifice of said pressurized container open to an interior chamber of said pressurized container;
   (b) a fluid discharge path in the valve body, between the outlet orifice of the pressurized container and an outlet orifice of the valve body;
   (c) a pressure regulator having a pressure sensing means capable of responding to sub-atmospheric pressure, integral to said valve body, in-line in the fluid discharge path, said pressure regulator pre-set to a pressure below atmospheric pressure to allow said gas to be delivered through said regulator from said interior chamber only when said pressure sensing means senses a downstream pressure at or below said pre-set pressure; and
   (d) a high pressure shut-off valve integral to said valve body, in-line in the fluid discharge path and upstream from said pressure regulator; whereby said gas may flow through from said interior chamber of said pressurized container through said fluid discharge path, through said outlet orifice of said pressurized container, and through said outlet orifice of said valve body only when said outlet orifice is connected to a vacuum system.

* * * * *

UNITED STATES PATENT AND TRADEMARK OFFICE
CERTIFICATE OF CORRECTION

PATENT NO. : 8,043,976 B2  
APPLICATION NO. : 12/406467  
DATED : October 25, 2011  
INVENTOR(S) : Raymond Nicholas Vrtis, Laura M. Matz and Mark Leonard O'Neill Page 1 of 1

It is certified that error appears in the above-identified patent and that said Letters Patent is hereby corrected as shown below:

Column 7

Line 48, delete "3000° C." and insert -- 300° C. --

Column 8

Line 33, delete "3000° C." and insert -- 300° C. --

Column 9

Line 64, delete "3000° C." and insert -- 300° C. --

Column 10

Line 15, delete "3000° C." and insert -- 300° C. --

Column 10

Line 58, delete "3000° C." and insert -- 300° C. --

Signed and Sealed this
Sixth Day of March, 2012

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 8,043,976 B2 |
| APPLICATION NO. | : 12/406467 |
| DATED | : October 25, 2011 |
| INVENTOR(S) | : Vrtis et al. |

It is certified that error appears in the above-identified patent and that said Letters Patent is hereby corrected as shown below:

In the Specification

Column 7, Line 54
Delete "3000° C." and insert -- 300° C. --

Column 9, Line 52
Delete "3000° C." and insert -- 300° C. --

Column 10, Line 15
Delete "3000° C." and insert -- 300° C. --

Signed and Sealed this
Twenty-first Day of October, 2014

Michelle K. Lee
*Deputy Director of the United States Patent and Trademark Office*